US012652860B2

(12) United States Patent
Holland et al.

(10) Patent No.: US 12,652,860 B2
(45) Date of Patent: Jun. 9, 2026

(54) SEMICONDUCTOR DEVICE AND ESD PROTECTION DEVICE COMPRISING CHARGE CARRIER INJECTION STRUCTURE

(71) Applicant: NEXPERIA B.V., Nijmegen (NL)

(72) Inventors: Steffen Holland, Nijmegen (NL); Hans-Martin Ritter, Nijmegen (NL); Guido Notermans, Nijmegen (NL)

(73) Assignee: Nexperia B.V., Nijmegen (NL)

( * ) Notice: Subject to any disclaimer, the term of this patent is extended or adjusted under 35 U.S.C. 154(b) by 677 days.

(21) Appl. No.: 17/706,647

(22) Filed: Mar. 29, 2022

(65) Prior Publication Data

US 2022/0310587 A1     Sep. 29, 2022

(30) Foreign Application Priority Data

Mar. 29, 2021    (EP) ..................................... 21165469

(51) Int. Cl.
*H10D 89/60*     (2025.01)
*H10W 42/60*     (2026.01)

(52) U.S. Cl.
CPC ............ *H10D 89/60* (2025.01); *H10W 42/60* (2026.01)

(58) Field of Classification Search
CPC ........... H01L 21/0262; H01L 21/02293; H01L 21/02381; H01L 21/02532;
(Continued)

(56) References Cited

U.S. PATENT DOCUMENTS 7,838,939 B2    11/2010  Russ et al.
8,304,838 B1 *  11/2012  Chen ................... H01L 27/0255
                                                          257/370
(Continued)

FOREIGN PATENT DOCUMENTS

CN          108565260 B       10/2020
CN          109065537 B   *   1/2021    ......... H01L 27/0262
DE       102006023429 A1      11/2007

OTHER PUBLICATIONS

Siu, Christopher. "Introduction to the BJT." Electronic Devices, Circuits, and Applications. Cham: Springer International Publishing, 2022. 41-63. (Year: 2022).*

(Continued)

*Primary Examiner* — Lex H Malsawma
*Assistant Examiner* — Ethan Edward Cutler
(74) *Attorney, Agent, or Firm* — Ruggiero McAllister & McMahon LLC

(57)          ABSTRACT

An electrostatic discharge protection device is provided. The present device relates to a semiconductor device that is particularly suitable as a component for electrostatic discharge protection. The semiconductor device comprises a first structure, including: a third semiconductor region of the second charge type, a fourth semiconductor region of the first charge type and being spaced apart from the third semiconductor region, and a first connection element configured to electrically connect the third semiconductor region to the fourth semiconductor region. The third semiconductor region is arranged in between the first semiconductor region and the fourth semiconductor region, and the fourth semiconductor region is arranged in between the second semiconductor region and the third semiconductor region.

20 Claims, 12 Drawing Sheets

(58) Field of Classification Search
    CPC ......... H01L 21/02658; H01L 21/02661; H01L
         21/324; H01L 21/67063; H01L 21/67075;
         H01L 21/67115; H01L 21/6723; H01L
         21/02016; H01L 21/02019; H01L
         21/67219; H01L 21/67248; C23C 16/01;
         C23C 16/24; C23C 16/02; C30B 25/20;
         C30B 29/06
    See application file for complete search history.

(56)                    References Cited

U.S. PATENT DOCUMENTS

| | | | |
|---|---|---|---|
| 2002/0093022 A1 | 7/2002 | Otsuka et al. | |
| 2005/0133873 A1 | 6/2005 | Li et al. | |
| 2006/0125015 A1* | 6/2006 | Woo .................... | H01L 27/0248 |
| | | | 257/357 |
| 2008/0067587 A1* | 3/2008 | Gossner .............. | H01L 27/0262 |
| | | | 257/E29.279 |
| 2014/0167106 A1* | 6/2014 | Salcedo .................. | H01L 29/78 |
| | | | 257/146 |
| 2017/0271320 A1 | 9/2017 | Salcedo et al. | |

OTHER PUBLICATIONS

Jeong, Chi-Hyeon, et al. "A study on the electrical characteristics of
different wire materials." Journal of the Microelectronics and Pack-
aging Society 20.4 (2013): 47-52. (Year: 2013).*
Extended European Search Report for corresponding European
application No. 21165469.4, 8 pages, dated Sep. 16, 2021.

\* cited by examiner

1

20

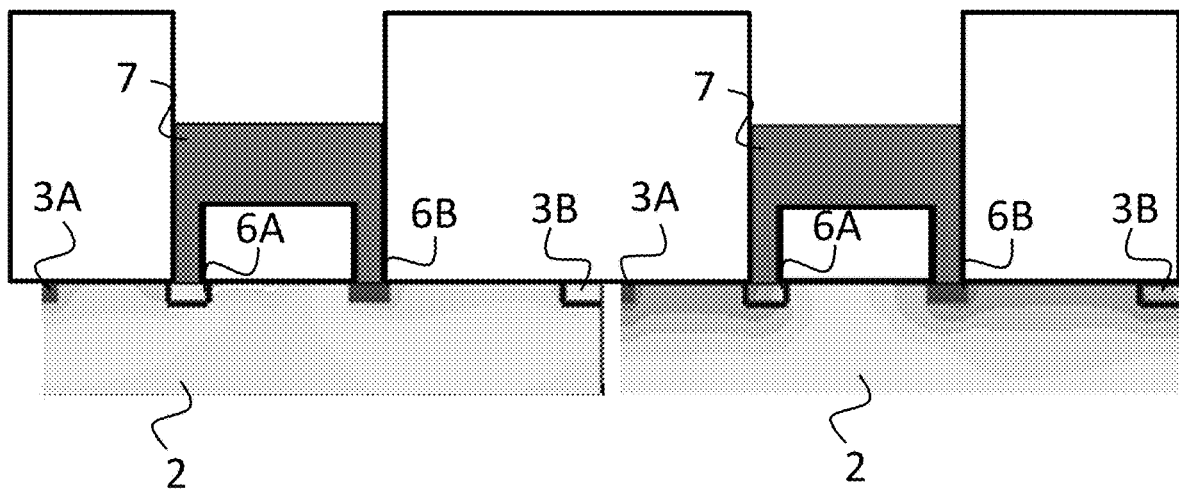
Figure 6A                    Figure 6B
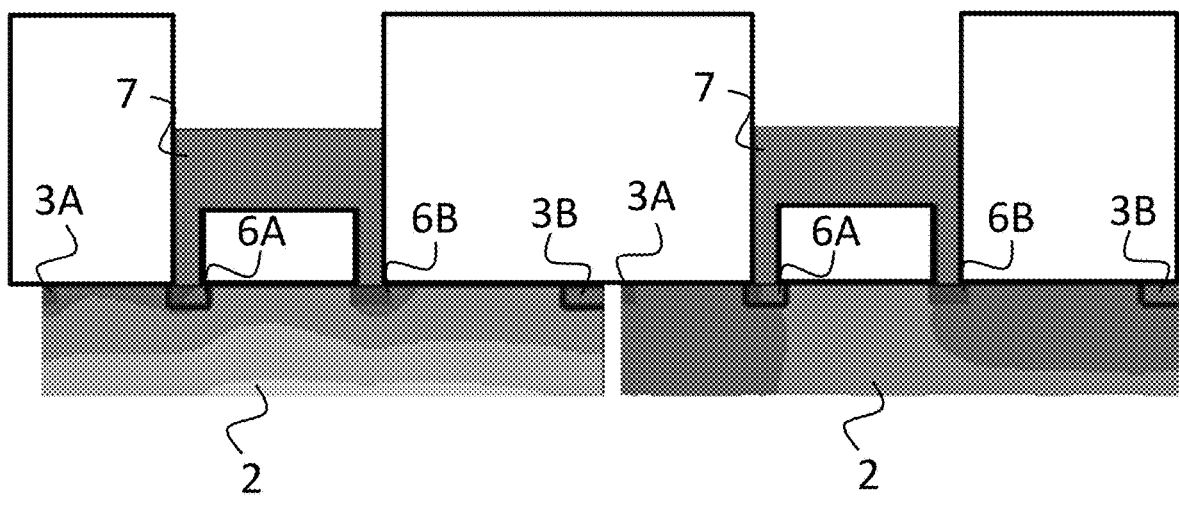
Figure 6C                    Figure 6D

SEMICONDUCTOR DEVICE AND ESD PROTECTION DEVICE COMPRISING CHARGE CARRIER INJECTION STRUCTURE

CROSS REFERENCE TO RELATED APPLICATION

This application claims the benefit under 35 U.S.C. § 119(a) of European Application No. 21165469.4 filed Mar. 29, 2021, the contents of which are incorporated by reference herein in their entirety.

BACKGROUND OF THE DISCLOSURE

1. Field of the Disclosure

The present disclosure relates to an electrostatic discharge protection device. More in particular, the present disclosure relates to a semiconductor device that is particularly suitable as a component for electrostatic discharge protection.

2. Description of the Related Art

Electronic devices and circuits may be subject to electrostatic discharge (ESD) events, for example due to close contact between said device (or circuit) with a differently-charged object, or due to a breakdown of a dielectric between said device (or circuit) and said object, resulting in a sudden flow of electricity. Excessive currents due to a sudden discharge from an ESD event can cause significant and/or permanent damage to sensitive electronic devices.

ESD protection devices can be used to prevent such damage to electronic devices or circuits. For example, a dedicated ESD protection device can be electrically connected in parallel to the electronic device to shunt the ESD current. Alternatively, an ESD protection circuit can be integrated with said electronic device into a single integrated circuit (IC). An exemplary configuration is shown in FIG. 1, in which an ESD protection device 30 is connected in between, for example, a signal line 41 and a rail line 42 of an electronic circuit 40, such as an IC.

Generally, the ESD protection device or circuit has a relatively high current handling capability, and prevents or limits a current due to an ESD event from flowing through the sensitive electronic device(s) by allowing a substantial portion of said current to flow through the ESD protection device instead. At the same time, the ESD protection device should limit the voltages within the sensitive electronic device(s) to sufficiently low levels to prevent damage to connected electronic devices to be protected.

A diode is a commonly used component for ESD protection purposes. Typically, an ESD protection diode has one or more unit cells. An example of a unit cell of a diode 1 known in the art is illustrated in FIG. 2. Here, diode 1 comprises a semiconductor body 2, in which a first semiconductor region 3A of a first charge type and a second semiconductor region 3B of a second charge type are arranged for example by means of ion implantation. First semiconductor region 3A may correspond to the anode of diode 1, and second semiconductor 3B may correspond to the cathode of diode 1. As shown in FIG. 2, first and second semiconductor regions 3A and 3B are spaced apart from each other at a distance d.

Furthermore, diode 1 comprises a first contact element 4A configured to provide an electrical contact to first semiconductor region 3A, and a second contact element 4B configured to provide an electrical contact to second semiconductor region 3B. First and second contact elements 4A and 4B may be formed in a metal layer of a metal layer stack. First and second contact elements 4A and 4B may also be referred to as the terminals of diode 1, i.e., the anode terminal and the cathode terminal, respectively.

Typically, first and second semiconductor regions 3A, 3B, and first and second contact elements 4A, 4B are configured as interdigitated stripes, wherein a pair of adjacent stripes can be referred to as a unit cell.

At the onset of an ESD event, diode 1 must switch from a high-impedance to a low-impedance state by filling semiconductor body 2 with mobile charge carriers, i.e., holes from the anode and electrons from the cathode, thereby reducing the resistance of semiconductor body 2 and allowing the ESD current to flow through diode 1. Before the semiconductor body 2 is flooded with mobile charge carriers, the voltage across semiconductor body 2 rises strongly, which in turn results in a rising voltage drop between the terminals of diode 1. Said voltage can, during at least a portion of the ESD event, greatly exceed a forward voltage associated with the diode. This phenomenon may be referred to as a transient overvoltage, and can at least partially be attributed to the fact that the flooding of semiconductor body 2 with mobile charge carriers cannot occur instantaneously, for example due to a limited number and mobility of said mobile charge carriers. In general, for larger distances between anode and cathode, more time is required for semiconductor body 2 to be filled with mobile charge carriers. Consequently, the duration and magnitude of the overvoltage across diode 1 depends strongly on distance between anode and cathode, that is, distance d between first and second semiconductor regions 3A and 3B. This transient overvoltage can damage various electronic components in circuits connected to diode 1 or a corresponding ESD protection circuit comprising said diode. For example, the overvoltage may result in significant damages to a gate oxide of a field-effect transistor (FET) included in a device or circuit that is to be protected by diode 1 or by the ESD protection circuit in which it is incorporated.

One approach for reducing the above described voltage overshoot is to reduce the distance d between anode and cathode. However, doing so additionally results in an increase of a parasitic capacitance between first and second contact elements 4A and 4B, thereby increasing the total device capacitance and degrading the performance of the protected device or circuit. This may be particularly detrimental in high speed applications, such as high speed communication interfaces (e.g., universal serial bus (USB) or Thunderbolt), in which only a limited capacitive load can be tolerated, lest the transmission speed is degraded.

In other words, there is a trade-off between the parasitic capacitance between first and second contact elements 4A and 4B and the overvoltage that may occur during an ESD event. Put differently, in order for the voltages in an ESD sensitive circuit or device to be remain below a given level during an ESD event, the anode and cathode of diode 1, or the ESD protection device or circuit in which it is incorporated, should be arranged closely together. However, such close arrangement will increase the capacitive loading of the ESD sensitive circuit or device.

It will be appreciated that semiconductor devices other than the one shown in FIG. 2, such as semiconductor-controlled rectifier (SCR) diodes or bipolar junction transistors (BJTs), may similarly be susceptible to a transient overvoltage due to a sudden flow of current, and may thus experience the same trade-off as discussed above with reference to diode 1 in FIG. 2. In particular, a distance between terminals in semiconductor devices in general is an important factor for the switching speed of said semiconductor devices, as well as for a capacitance between said terminals.

SUMMARY

It is an object of the present disclosure to provide a semiconductor device for which the above-mentioned problems are prevented or limited.

This object is achieved with the diode according to claim 1 that is characterized in that at least one unit cell among the one or more unit cells comprises a first structure, comprising: a third semiconductor region of the second charge type, a fourth semiconductor region of the first charge type, and a first connection element configured to electrically connect the third semiconductor region to the fourth semiconductor region, wherein the third semiconductor region is arranged in between the first semiconductor region and the fourth semiconductor region, and wherein the fourth semiconductor region is arranged in between the second semiconductor region and the third semiconductor region.

During an ESD event, the semiconductor device according to the present disclosure will first operate in a first mode during which the semiconductor body is not sufficiently flooded. In this first mode, the current will mostly flow from the first to the third semiconductor region, from the third semiconductor region to the fourth semiconductor region through the first connection element, and from the fourth semiconductor region to the second semiconductor region. Hereinafter, this current path is referred to as the indirect current path. In other words, the first connection element serves as a bypass element forming an indirect current path through which current can flow until the resistance of the semiconductor body becomes sufficiently low due to charge carriers injected into said semiconductor body. For example, if the semiconductor device is a diode-type semiconductor device, the operation of the semiconductor device in the first mode generally corresponds to the series combination of two diodes of which one has its anode and cathode arranged as the first and third semiconductor regions, and of which the other has its anode and cathode arranged as the fourth and second semiconductor regions, respectively.

After the semiconductor body has been sufficiently flooded with mobile charge carriers, the semiconductor device of the present disclosure will operate in a second mode. During this second mode, a direct current path is used, namely a current path directly from the first semiconductor region to the second semiconductor region. This direct current path is, for example, not available in the abovementioned series connection of two diodes. In addition to mobile charge carriers injected from the first and second semiconductor regions, the first structure allows mobile charge carriers to be injected from the third and fourth semiconductor regions.

The first and second contact elements are generally designed to be able to handle a given maximum current density. Generally, the first and second semiconductor regions are each configured as a finger. Similarly, the first and second contact elements may be configured as fingers having a finger pattern corresponding to that of the first and second semiconductor regions, respectively. Moreover, these fingers are interdigitated with a single first contact pad on one side of the semiconductor device, and a single second contact pad on an opposing side of the semiconductor device for external connection. The maximum current density through each finger-shaped contact element can be computed from $Imax/(n \times Afinger)$, wherein Imax is an assumed maximum current during an ESD event, n the number of fingers, and Afinger the cross-sectional area of each finger-shaped contact element corresponding to the width times the height (or thickness) of each finger-shaped contact element. Here, it is noted that the length of a finger is taken in a direction from the first to the second semiconductor region, and a width of a finger is taken perpendicular to this direction.

The maximum current density through the first connection element can be computed from $Imax/(n \times Aconnection)$, wherein Aconnection is the cross-sectional area of the first connection element corresponding to the width times the height of the first connection element. Generally, the width of the first connection element is substantially equal to the width of the first and second contact elements and considerably greater than the length of the first and second contact element. Consequently, the height of the first connection element can be chosen much smaller than the height of the first and second contact element for the same maximum current density. As a result, the capacitance between the first contact element and the first connection element will be considerably lower than the capacitance of a semiconductor device having its first and second contact element separated at a similar distance as the first and third semiconductor regions, respectively, and the capacitance between the second contact element and the first connection element will be considerably lower than the capacitance of a semiconductor device having its first and second separated at a similar distance as the fourth and second semiconductor regions, respectively. Hence, the semiconductor device of the present disclosure displays a lower overvoltage due to the indirect current path while having only a minor impact on the capacitance.

The semiconductor body may be an undoped, intrinsic or semi-intrinsic semiconductor region or may be a semiconductor region of the first or second charge type. A dopant concentration of the semiconductor body may be substantially less than a respective dopant concentration of each of the first to fourth semiconductor regions. Each unit cell may be operable in a first state and in a second state based on a voltage difference between the first contact element and the second contact element. For example, the first state may be an on-state or an activated state of the semiconductor device, and the second state may be an off-state or deactivated state of the semiconductor device. For example, if the semiconductor device is a diode, the first state may be a forward state in which a forward voltage is applied across the first and second contact elements, and the second state may be a reverse state or off-state in which a reverse voltage is applied to the first and second contact elements.

Consequently, a resistance between the first contact element and the second contact element may be substantially greater in the second state than in the first state due to a substantially lower number of charge carriers in the semiconductor body. While transitioning from the first state to the second state, the first to fourth semiconductor regions may each be configured to inject charge carriers of their respective charge type into the semiconductor body.

In some embodiments, each unit cell forms a PiN-diode. Alternatively, each unit cell may further comprise a first additional semiconductor region of the second charge type that surrounds the first semiconductor region, and a second additional semiconductor region of the first charge type that surrounds the second semiconductor region, thereby forming a semiconductor-controlled rectifier, 'SCR', diode. In yet another alternative, each unit cell may further comprise a third additional semiconductor region, wherein the third additional semiconductor region is surrounded by the first semiconductor region, thereby forming a bipolar junction transistor, 'BJT'.

A size of the first structure along the length of a finger need not be equal to the length of said finger. For example, the first structure (i.e., the third and fourth semiconductor regions) may have a width that is smaller than the finger length. In that case, at least one unit cell among the one or more unit cells may comprise a plurality of said first structures arranged in between the first and second semiconductor region. The plurality of first structures may be spaced apart from one another along a direction perpendicular to a direction from the first semiconductor region to the second semiconductor region. In other words, the plurality of first structures may be arranged in between the fingers along a 'length' of said fingers.

When the semiconductor device comprises two or more unit cells, the semiconductor device may further comprise one or more second structures, comprising a fifth semiconductor region of the first charge type, a sixth semiconductor region of the second charge type, and a second connection element configured to electrically connect the fifth semiconductor region to the sixth semiconductor region. Each of the one or more second structures may be arranged in between a respective pair of adjacent unit cells of the semiconductor device. Furthermore, the fifth semiconductor region may be arranged in between the sixth semiconductor region and the second semiconductor region of a unit cell among said pair of adjacent unit cells, and the sixth semiconductor region may be arranged in between the fifth semiconductor region and the first semiconductor region corresponding to another unit cell among said pair of adjacent unit cells.

By including second structures in between adjacent unit cells of the semiconductor device, charge carriers can also be injected into the semiconductor body at a region in between the first semiconductor region of a unit cell and the second semiconductor region of an adjacent unit cell. Consequently, a switching time of the semiconductor device structure formed by the first semiconductor region of a unit cell and the second semiconductor region of an adjacent unit cell can also be reduced, for example when the unit cells of the semiconductor device are arranged as parallel fingers.

At least one unit cell among the one or more unit cells may further comprise a third structure, comprising a seventh semiconductor region of the second charge type, an eighth semiconductor region of the first charge type, and a third connection element configured to electrically connect the seventh semiconductor region to the eighth semiconductor region.

The third structure may be arranged in between the first semiconductor region and the first structure, and the seventh semiconductor region may be arranged in between the first semiconductor region and the eighth semiconductor region. Alternatively, the seventh semiconductor region may be arranged in between the first semiconductor region and the third semiconductor region, and the eighth semiconductor region may be arranged in between the second semiconductor region and the fourth semiconductor region. In another embodiment, the seventh semiconductor region may be arranged in between the first semiconductor region and the third semiconductor region, and the eighth semiconductor region may be arranged in between the third semiconductor region and the fourth semiconductor region. Preferably, each of the first to eighth semiconductor regions may be mutually spaced apart from one another in a first direction from the first to the second semiconductor region and/or in a second direction perpendicular to the first direction. If needed, the first and third connection elements may be offset relative to each along the second direction to avoid electrical contact between the first and third connection elements.

The seventh semiconductor region can be spaced apart from the third semiconductor region in the first and second direction, and a distance between the first and third semiconductor region can be smaller than a distance between the first and seventh semiconductor region. Similarly, the eighth semiconductor region can be spaced apart from the fourth semiconductor region in the first and second direction, and a distance between the fourth and second semiconductor region can be smaller than a distance between the eighth and second semiconductor region. Optionally, the third connection element can be physically connected to the first connection element, and/or the at least one of the one or more unit cells may further comprise a first intermediate semiconductor region of the second charge type arranged in between and connected to the third and seventh semiconductor region and/or a second intermediate semiconductor region of the first charge type arranged in between and connected to the fourth and eighth semiconductor region. In this latter case, the said unit cell(s) may further comprise an intermediate connection element configured to electrically connect the first intermediate semiconductor region to the second intermediate region, the intermediate connection element being preferably coupled to the first and second connection elements.

In this last embodiment, the structures arranged in between the first and second semiconductor regions vary in the sense that the distance between the first and second semiconductor regions and these structures vary in the second direction. At each position along this second direction, only a single structure is arranged in between the first and second semiconductor regions. In this manner, the trade-off between current carrying capability and capacitance can be varied within a single semiconductor device. This may allow a better trade-off to be reached than for semiconductor devices having a single separation between the first and second semiconductor regions and the structures in between them.

In the embodiments discussed above, the third structure further reduces the time required for the unit cell to activate due to additional charge carriers being injected into the semiconductor body.

The first contact elements of each unit cell among the one or more unit cells may be mutually electrically connected. Additionally or alternatively, the second contact elements of each unit cell among the one or more unit cells may be mutually electrically connected.

The first connection element and/or, if applicable, the second connection element and/or the third connection element may comprise a conductive material, typically one of aluminium, copper, gold, silver, or polysilicon or tungsten or titanium.

The conductive material is arranged on top of a part of the semiconductor body and corresponding semiconductor regions.

Alternatively, the semiconductor device may comprise a metal layer stack. The metal layer stack may comprise one or more metal layers that are mutually separated from each other and from the semiconductor body using a respective insulating layer among one or more insulating layers, and one or more vias for electrically connecting metal layers on different levels of the metal layer stack and for connecting a lowest metal layer in the metal layer stack to the semiconductor body. The first connection element and/or, if applicable, the second connection element and/or the third connection element may be formed using the metal layer stack. Furthermore, at least a part of the conductive material may be separated from the semiconductor body by an insulating layer among the one or more insulating layers or by air.

The first contact element and the second contact element of the one or more unit cells may be formed using the metal layer stack. In that case, a number of metal layers used for the formation of the first contact element and/or the second contact element may be greater than a number of metal layers used for the formation of the first connection element and/or, if applicable, the second connection element and/or the third connection element.

The first connection element and/or, if applicable, the second connection element and/or the third connection element may comprise a resistor, preferably a resistor with an adjustable resistance, or a switchable device, such as a field-effect transistor (FET).

For example, if an adjustable resistor is used, the resistance thereof may be controlled by a controller. The controller may be configured to control the resistance of the resistor upon detecting that an ESD event is taking place, for example based on a voltage (e.g., an overvoltage) across the semiconductor device. In that case, the resistance of the adjustable resistor may be reduced to allow a current to flow through the respective connection element.

Similarly, if a switchable device (e.g., an FET) is used, the switchable device may be controlled by the controller. The controller may be configured to set the switchable device to an on-state or an off-state based on whether an ESD event is taking place such as to respectively allow or prevent a current from flowing through the respective connection element. The first to fourth semiconductor regions and, if applicable, the fifth to eighth semiconductor regions may be ion-implanted regions.

The first charge type may correspond to a p-type doping or an n-type doping, and the second charge type may correspond to an n-type doping or a p-type doping, respectively.

Each of the one or more unit cells may be substantially identical to one another. Additionally or alternatively, the semiconductor body may be based on one of silicon (Si), silicon carbide (SiC), gallium nitride (GaN), and gallium arsenide (GaAs), technology.

According to another aspect of the present disclosure, an ESD protection device is provided that is configured to be electrically connected in parallel to an electronic circuit and to protect said electronic circuit from ESD events. The ESD protection device comprises one or more semiconductor devices as defined above. The ESD protection device may be a packaged device.

According to yet another aspect of the present disclosure, a device is provided that comprises an electronic circuit integrated in a semiconductor body, and one or more semiconductor devices as defined above. The one or more semiconductor devices are integrated in the semiconductor body and are connected to the electronic circuit to protect said electronic circuit against ESD events. The device may be a packaged device.

BRIEF DESCRIPTION OF THE DRAWINGS

Next, the present disclosure will be described with reference to the appended drawings, wherein:

FIGS. 6A-6D illustrate charge carrier concentrations in the unit cell of FIG. 3A or 4 at different moments in time during a simulated ESD event.

Hereinafter, reference will be made to the appended drawings. It should be noted that identical reference signs may be used to refer to identical or similar components.

DETAILED DESCRIPTION

Figure 1:
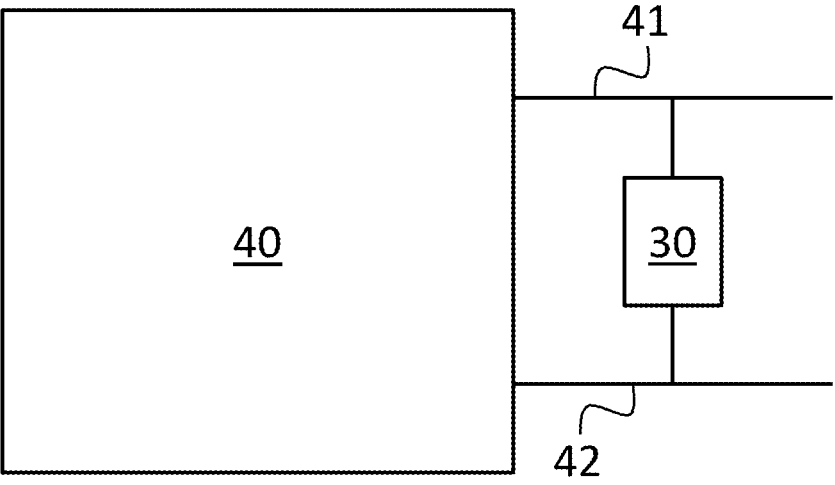
FIG. 1 is a schematic diagram including an ESD protection device connected to a circuit that is to be protected.
Figure 2:
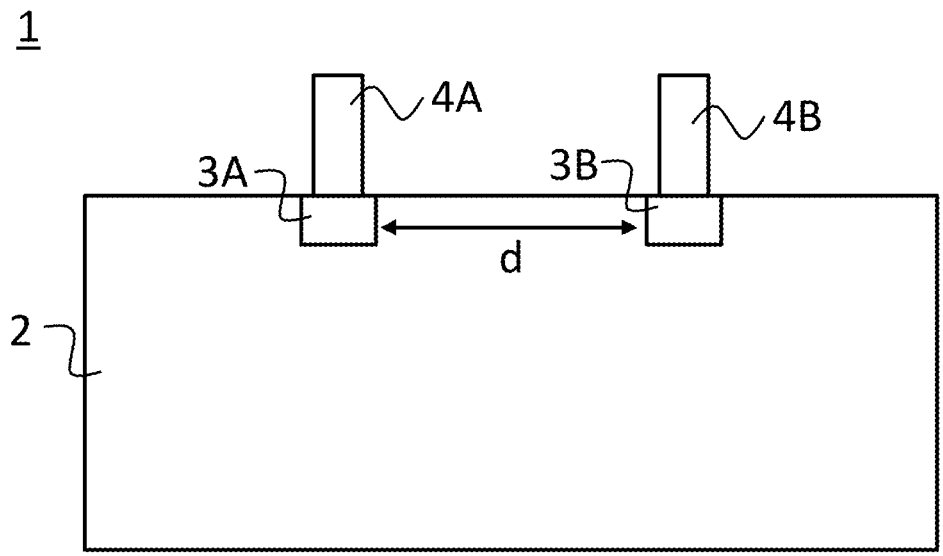
FIG. 2 is a cross-sectional view of a diode known in the art.
Figure 3A:
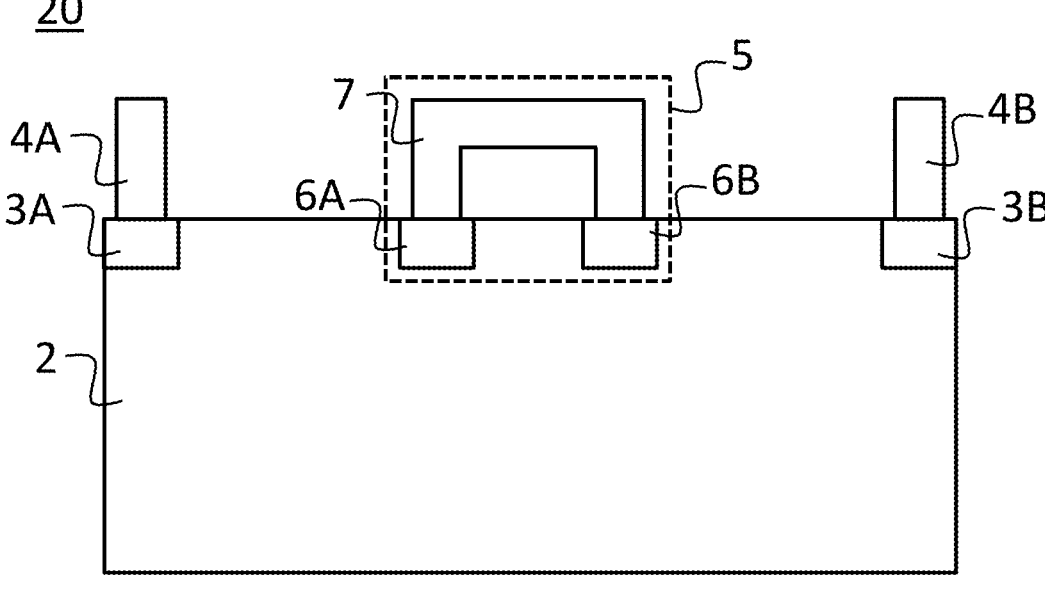
FIGS. 3A and 3B are cross-sectional views of a unit cell of a diode according to embodiments of the present disclosure.

FIG. 3A shows a cross-section of a unit cell 20 of a semiconductor device 100, comprising a first semiconductor region 3A of the first charge type and a second semiconductor region 3B of the second charge type, arranged in a semiconductor body 2, similar to diode 1 as shown in FIG. 2.

Semiconductor body 2 may be an un-doped (i.e., intrinsic) semiconductor material, or may be lightly doped with respect to first and second semiconductor regions 3A and 3B, with dopants of the first or second charge type.

Unit cell 20 further comprises a first structure 5, comprising a third semiconductor region 6A of the second charge type, a fourth semiconductor region 6B of the first charge type, and a first connection element 7 configured to electrically connect third semiconductor region 6A to fourth semiconductor region 6B.

The first charge type may correspond to a p-type doping, and the second charge type may correspond to an n-type doping, or vice versa. For simplicity, in the remainder of the description, the first charge type is assumed to be p-type, and the second charge type is assumed to be n-type. Since unit cell 20 shown in FIG. 3A corresponds to a diode structure, first semiconductor region 3A (and/or first contact element 4A) then corresponds to the anode of unit cell 20, and second semiconductor region 3B (and/or second contact element 4B) corresponds to the cathode of unit cell 20.

During an ESD event, an electrical potential inside semiconductor body 2, i.e., in between the anode and cathode of unit cell 20, changes over time, with the electrical potential near the anode of unit cell 20 being greater than the electrical potential near the cathode of unit cell 20. Once the potential across a junction in between third semiconductor region 6A and semiconductor body 2 exceeds a built-in potential of said junction, electrons (i.e., n-type charge carriers) will start being injected into semiconductor body 2, which electrons are collected at first semiconductor region 3A of unit cell 20.

Since third semiconductor region 6A is electrically connected to fourth semiconductor region 6B, the charge of injected electrons is compensated by an equal amount of holes (i.e., p-type charge carriers) which flow into semiconductor body 2 at the junction between fourth semiconductor region 6B and semiconductor body 2, which holes are collected at the cathode of unit cell 20.

Consequently, first structure 5 enables injecting mobile charge carriers in between the cathode and anode of unit cell 20, such as at or near a middle region in between the cathode and anode, instead of only flooding semiconductor body 2 with charge carriers from outer ends of unit cell 20. In other words, first structure 5 enables flooding semiconductor body 2 with charge carriers at a faster rate with respect to conventional semiconductor devices (e.g., diode 1 of FIG. 2).

Since the distance between third semiconductor region 6A and first semiconductor region 3A, as well as a distance between fourth semiconductor region 6B and second semiconductor region 3B, is less than a distance between the anode and cathode of unit cell 20 (i.e., first and second semiconductor regions 3A and 3B), both the magnitude and the duration of the transient overvoltage due to the ESD event is significantly reduced. In addition, first structure 5 allows first and second semiconductor regions 3A and 3B to be spaced further apart, such that an effective capacitance of unit cell 20 of the corresponding semiconductor device is limited.

In FIG. 3A, first connection element 7 is shown as a line connection similar to first and second contact elements 4A and 4B, such as a connection through a metal layer in a metal layer stack. However, the present disclosure is not limited thereto. First connection element 7 may additionally or alternatively comprise a switchable device, such as a FET, or may comprise a resistor, such as an adjustable or tuneable resistor, through which third and fourth semiconductor regions 6A and 6B are electrically connected.

Figure 3B:
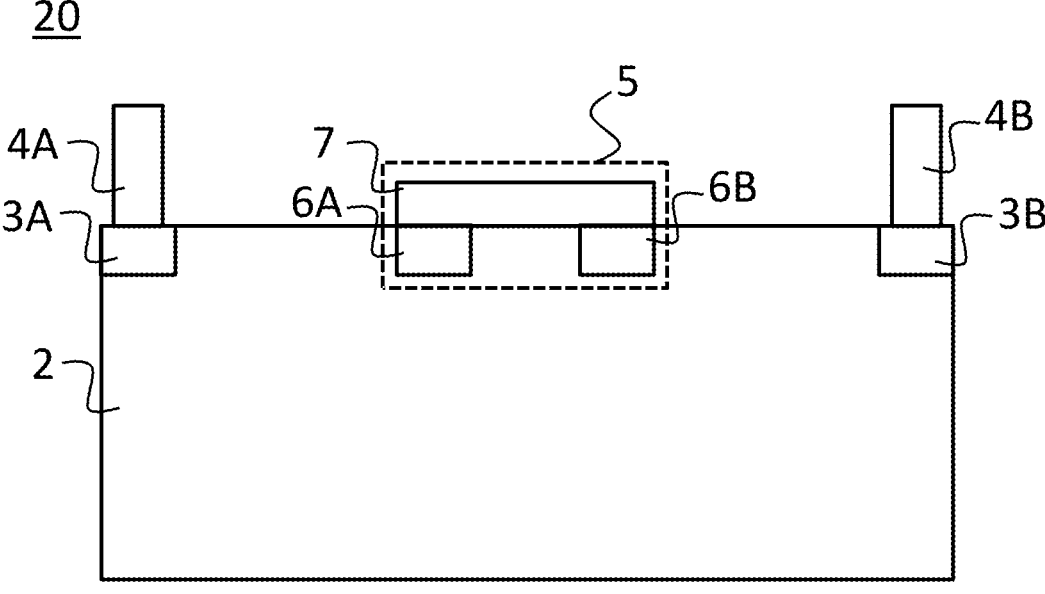

FIG. 3B shows a cross-sectional view of unit cell 20 according to another embodiment of the present disclosure. FIG. 3B differs from FIG. 3A in that first connection element 7 is arranged on top of semiconductor body 2, rather than being separated from semiconductor body 2 (e.g., by air or an insulating layer). For example, first connection element 7 may be a conductive material, such as a metal or a polysilicon material, which is deposited on top of a part of semiconductor body 2 such as to electrically connect third and fourth semiconductor regions 6A and 6B. As the semiconductor body 2 between third and fourth semiconductor regions 6A, 6B is at most lightly doped, little to no current will cross the junction between connection element 7 and semiconductor body 2 at this position.

Figure 4:
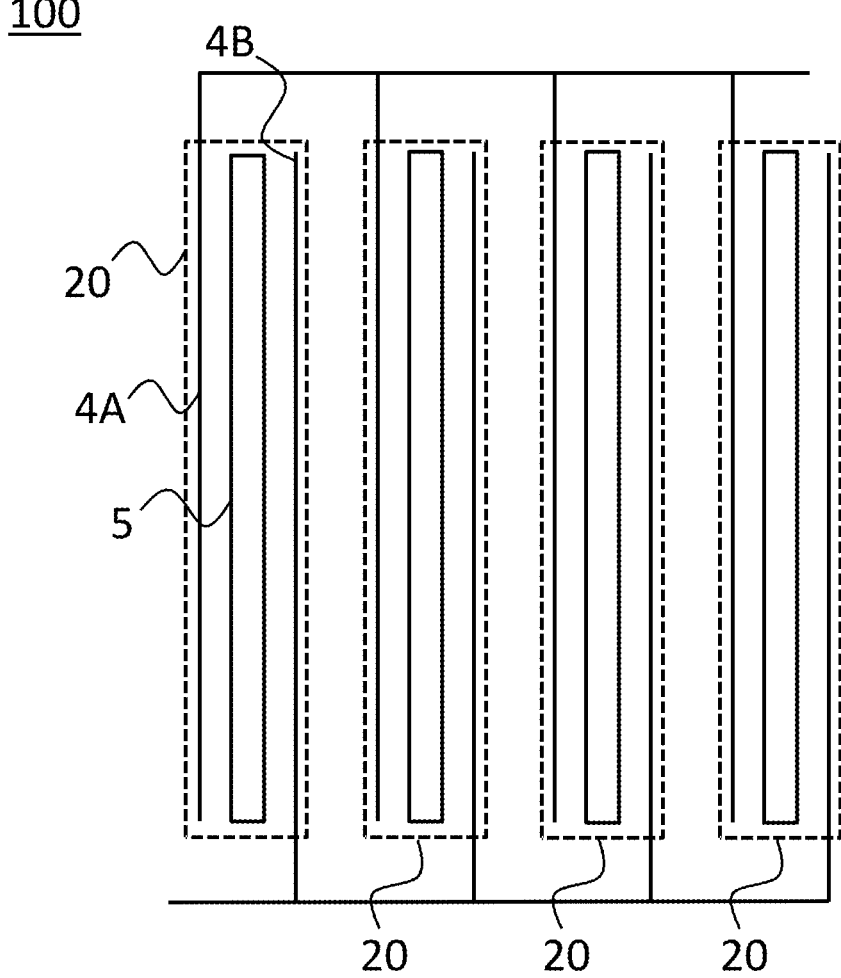
FIG. 4 is a top view of a diode comprising four unit cells according to an embodiment of the present disclosure.

FIG. 4 shows a top view of a semiconductor device 100 (e.g., a diode) comprising a plurality of unit cells 20, e.g., unit cell 20 as shown in FIG. 3A and/or FIG. 3B. In this embodiment, first and second semiconductor regions 3A and 3B of unit cells 20 are arranged in an interdigitated finger pattern. That is, semiconductor device 100 comprises a plurality of alternating strips of first and second semiconductor regions 3A and 3B, extending in a horizontal direction in semiconductor body 2. As shown in FIG. 4, first contact elements 4A of each unit cell 20 partially extend away from their respective unit cell 20 and can be mutually electrically connected at one end of semiconductor device 100 to thereby provide a single first terminal of semiconductor device 100. Similarly, second contact elements 4B of each unit cell 20 may partially extend away from their respective unit cell 20 and can be mutually electrically connected, for example at an opposite end of semiconductor device 100, for providing a single second terminal of semiconductor device 100. Semiconductor device 100 may for example be a diode, wherein the first terminal corresponds to an anode terminal of the diode, and the second terminal corresponds to a cathode terminal of the diode.

Optionally, first structure 5 may be omitted from one or more unit cells 20. In that case, a part of unit cells 20 comprising respective first structures 5 may activate relatively fast in response to an ESD event compared to remaining unit cells of semiconductor device 100 that do not have first structure 5. By changing the ratio of unit cells 20 with first structures 5 and unit cells without first structures 5, the trade-off between the capacitance of semiconductor device 100 and the overvoltage limiting capability of semiconductor device 100 can be adjusted. In addition, the one or more unit cells need not be identical.

Figure 5A:
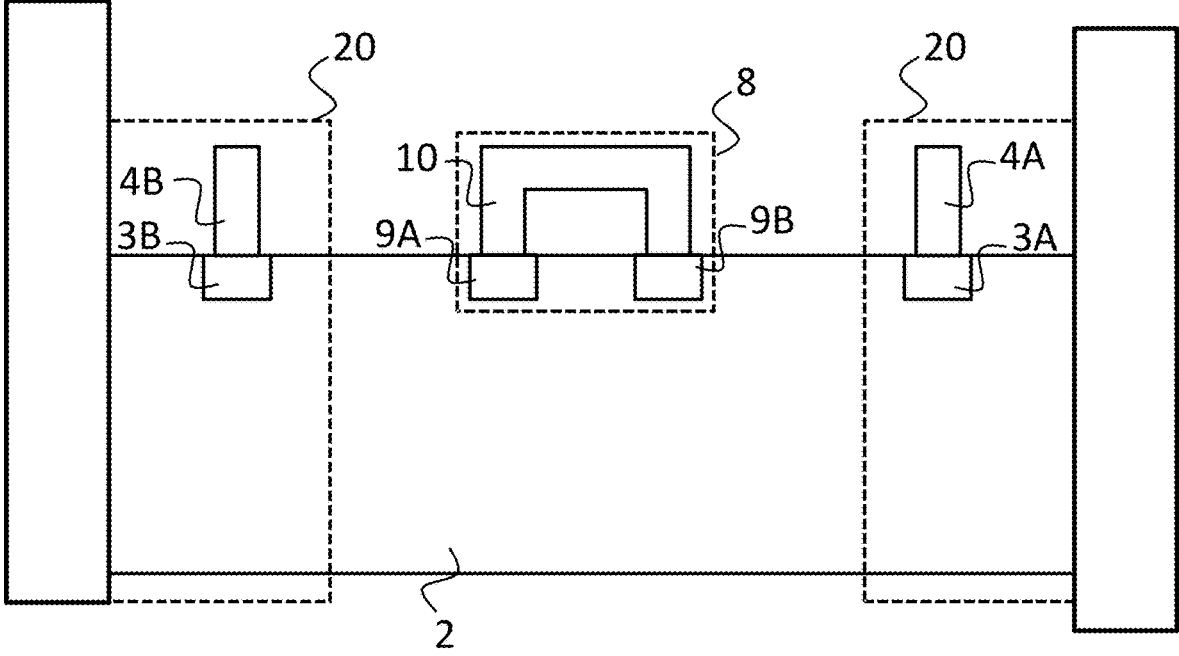
FIG. 5A is a cross-sectional view of a part of a diode in between adjacent unit cells according to another embodiment of the present disclosure.

In FIG. 5A, a cross-sectional view of a portion of semiconductor device 100 having at least two unit cells 20 is shown. In particular, FIG. 5A shows the cathode, i.e., second semiconductor region 3B, of a diode unit cell among a pair of adjacent unit cells, and the anode, i.e., first semiconductor region 3A, of another diode unit cell among said pair of adjacent unit cells.

Although the anode and cathode shown in FIG. 5A correspond to different unit cells, said anode and cathode may, together with semiconductor body 2, also function as a diode, similar to the diode in individual unit cells 20. In some embodiments, a distance between adjacent unit cells may be equal or similar to the distance between the cathode and anode of individual unit cells 20, such that each unit cell 20 not only individually functions as a diode, but also forms, with its anode and/or cathode, a substantially identical diode structure with the cathode and/or anode of an adjacent unit cell 20, respectively.

To this end, when semiconductor device 100 comprises two or more unit cells 20, semiconductor device 100 may comprise one or more second structures 8 comprising a fifth semiconductor region 9A of the first charge type, a sixth semiconductor region 9B of the second charge type, and a second connection element 10 configured to electrically connect fifth semiconductor region 9A to sixth semiconductor region 9B. Second structure 8 may be a horizontally mirrored, but otherwise identical version of first structure 5, and may function substantially identically to first structure 5.

Figure 5B:
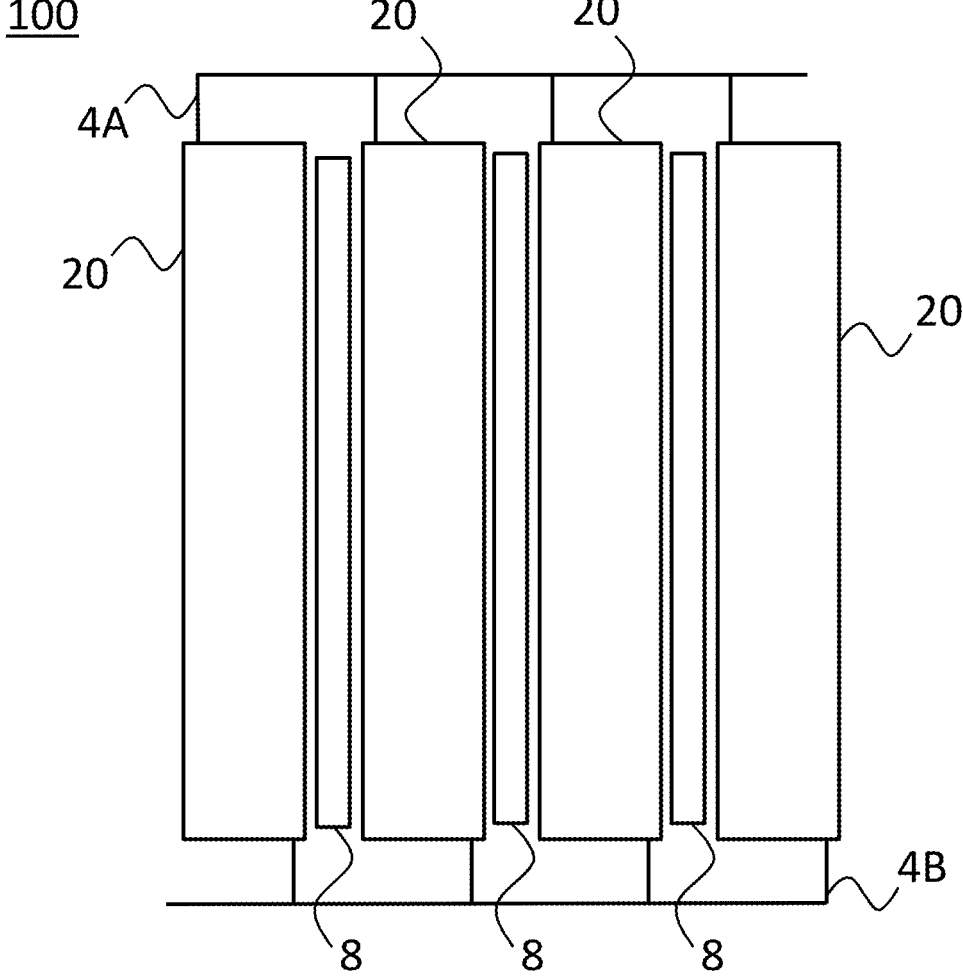
FIG. 5B is a top view of a diode according to another embodiment of the present disclosure.

In FIG. 5B, a top view of semiconductor device 100 is shown that differs from the top view in FIG. 4 in that second structures 8, in accordance with FIG. 5A, are arranged in between adjacent pairs of unit cells 20. As seen in FIG. 5B, with four unit cells 20, i.e., with four 'fingers', a total of seven parallel semiconductor device structures are realized. More generally, semiconductor device 100 may comprise N unit cells 20, thereby forming a total of 2N−1 parallel semiconductor device structures. In some embodiments, some of second structures 8 may be omitted, such that second structures 8 are only arranged in between some of the adjacent pairs of unit cells 20.

In FIGS. 6A-6D, examples of charge carrier concentrations inside semiconductor body 2 of unit cell 20 are shown at different moments in time during a simulated ESD event. In particular, darker shades in semiconductor body 2 shown in FIGS. 6A-6D represent greater charge carrier concentrations. It will be appreciated that, particularly when semiconductor body 2 is an undoped or (semi-)intrinsic semiconductor region or when semiconductor body 2 is relatively lowly doped with respect to first to fourth semiconductor regions 3A, 3B, 6A and 6B, the charge carrier concentration for p-type charge carriers (i.e., holes) may be similar to the charge carrier concentration for n-type charge carriers (i.e., electrons). Consequently, shaded regions in semiconductor body 2, as shown in FIGS. 6A-6D, may correspond to either one of hole concentrations and electron concentrations inside semiconductor body 2.

Prior to the ESD event, unit cell 20 is turned off, and semiconductor body 2 is substantially void of mobile charge carriers. As shown in FIG. 6A, briefly after the onset of the ESD event, charge carriers start being injected into semiconductor body 2 due to a rising electrical potential in semiconductor body 2, thereby lowering the resistance of semiconductor body.

After some time, the charge carrier concentration in FIG. 6B is reached. Due to first structure 5, additional charge carriers are injected into semiconductor body 2 in between first and second semiconductor regions 3A and 3B. As a result, the charge carrier concentration in a region between first and third semiconductor regions 3A and 6A and a region between second and fourth semiconductor regions 3B and 6B increases sharply, thereby decreasing the resistance of semiconductor body 2 in said regions. As a result, said regions, in combination with first connection element 7, allow a current to flow from first contact element 4A to second contact element 4B, despite semiconductor body 2 not being fully flooded with charge carriers. This mode of operation is referred to as the first mode described earlier.

As seen in FIGS. 6C and 6D, the charge carrier concentration in semiconductor body 2 further increases with respect to FIG. 6B until the resistance of semiconductor body 2 is sufficiently lowered to allow the bulk of the ESD current to flow from first semiconductor region 3A to second semiconductor region 3B via that part of semiconductor body 2 that is arranged between third and fourth semiconductor regions 6A, 6B. Once semiconductor body 2 is fully and substantially homogeneously flooded with charge carriers such that little to no current flows through first structure 5 with respect to the current flowing through semiconductor body 2, semiconductor device 100 operates in the second mode described earlier.

Figure 7:
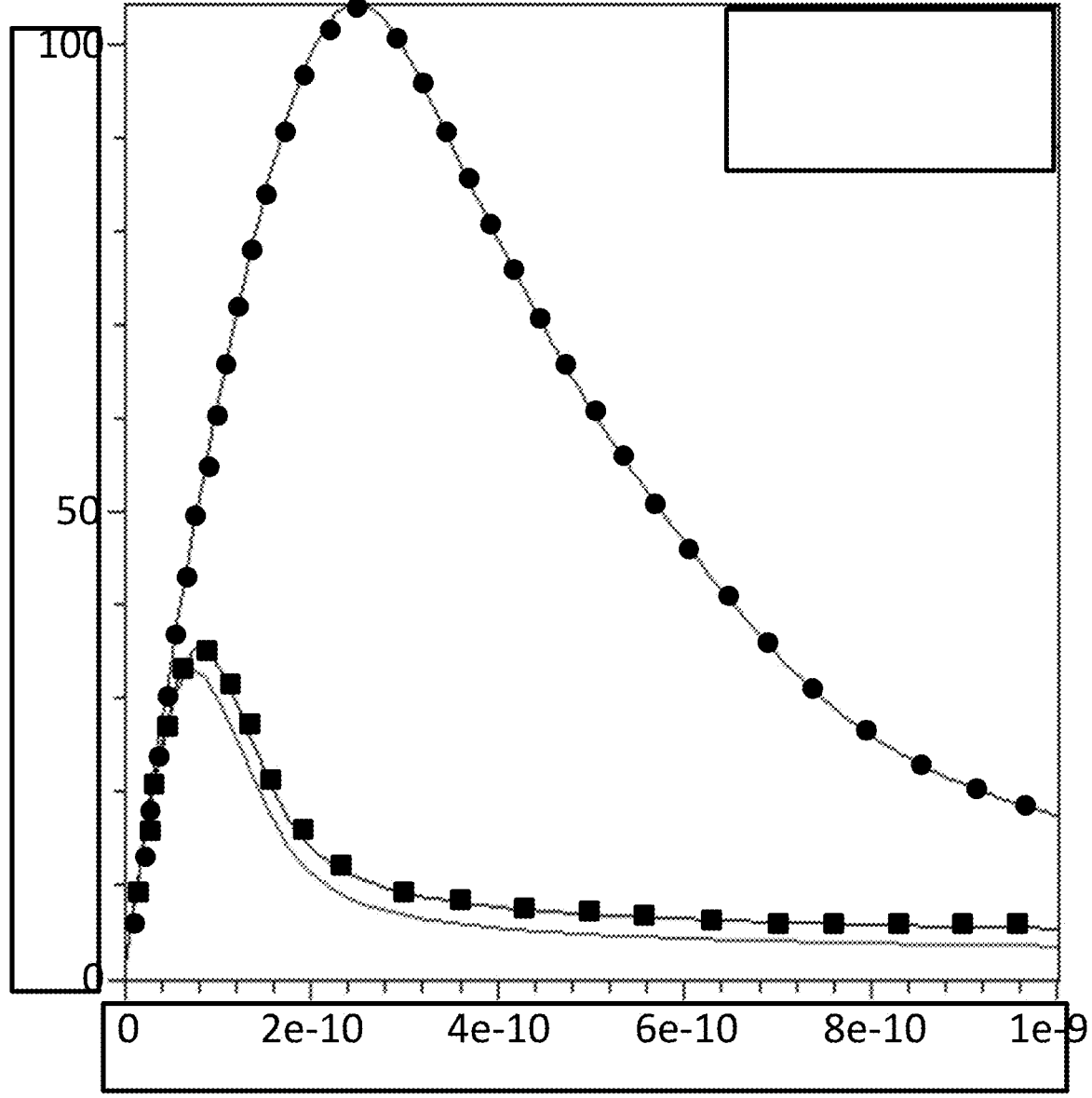
FIG. 7 illustrates diode voltages over time during a simulated ESD event.

FIG. 7 shows a voltage across semiconductor device 100, in the case of a diode, versus time during a simulated ESD event, indicated with a solid line marked with squares. The horizontal axis corresponds to the elapsed time since the start of the ESD event in seconds, and the vertical axis corresponds to a voltage across the diode in Volts. Furthermore, for comparison, FIG. 7 also shows the voltage across a first and second reference diode, in accordance with diode 1 of FIG. 2, versus time during the simulated ESD event. The first and second reference diode differ in that a distance between first and second semiconductor regions 3A and 3B of the first reference diode is less than a distance between first and second semiconductor regions 3A and 3B of the second reference diode. The transient overvoltage corresponding to the first reference diode is indicated with a solid line having no markings, and the transient overvoltage corresponding to the second reference diode is indicated with a solid line marked with circles.

For the first reference diode, the distance between anode and cathode is set to 2 micrometers, and for the second reference diode, the distance between anode and cathode is set to 6 micrometers. For semiconductor device 100, the distance between first and second semiconductor regions 3A and 3B is equal to 6 micrometers. Furthermore, the distance between the first and third semiconductor region 3A and 6A as well as the distance between third and fourth semiconductor region 6A and 6B and the distance between second and fourth semiconductor region 3B and 6B is equal to 2 micrometers.

As seen in FIG. 7, although the distance between first and second semiconductor region 3A and 3B of semiconductor device 100 is greater than the distance between first and second semiconductor region 3A and 3B of the first reference diode, the magnitude and duration of the transient overvoltage is not significantly increased. On the other hand, as can be seen by comparing the first and second reference diodes, the performance degradation due to the increased distance between first and second semiconductor region 3A and 3B is significant when first structures 5 are not included in the diode.

Figure 8:
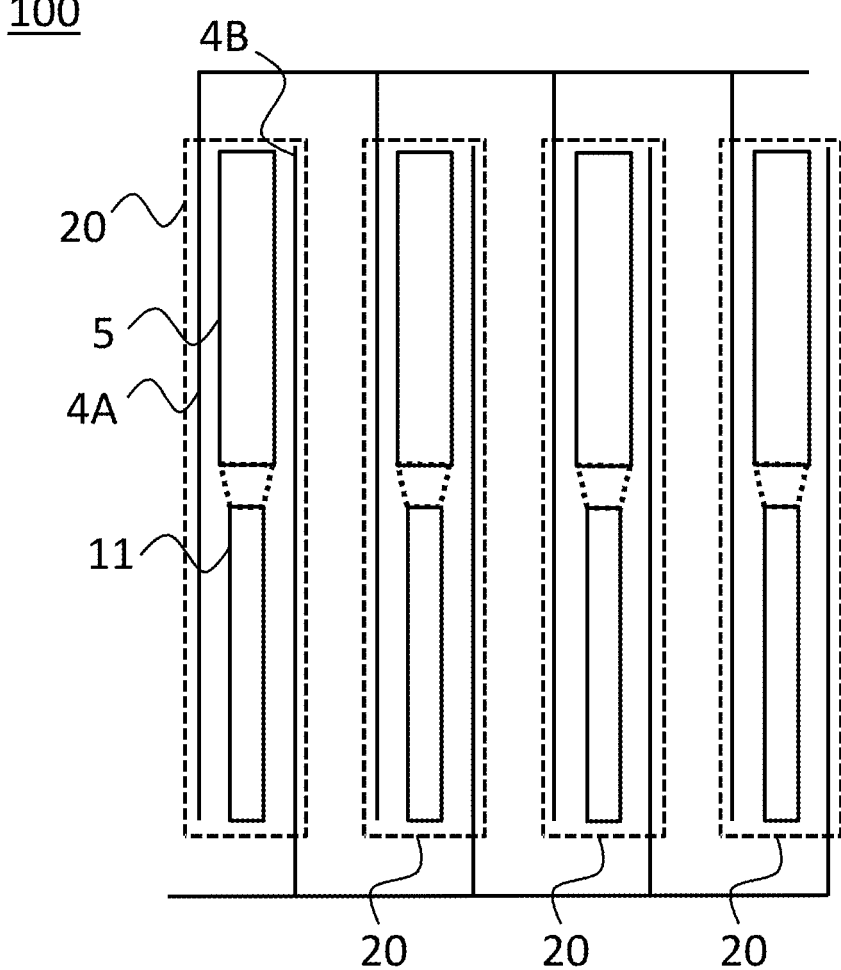
FIG. 8 is a top view of a diode according to another embodiment of the present disclosure.

In FIG. 8, a top view of semiconductor device 100 according to another embodiment of the present disclosure is shown. In this embodiment, unit cells 20 comprise a third structure 11 in addition to first structure 5.

Figure 9A:
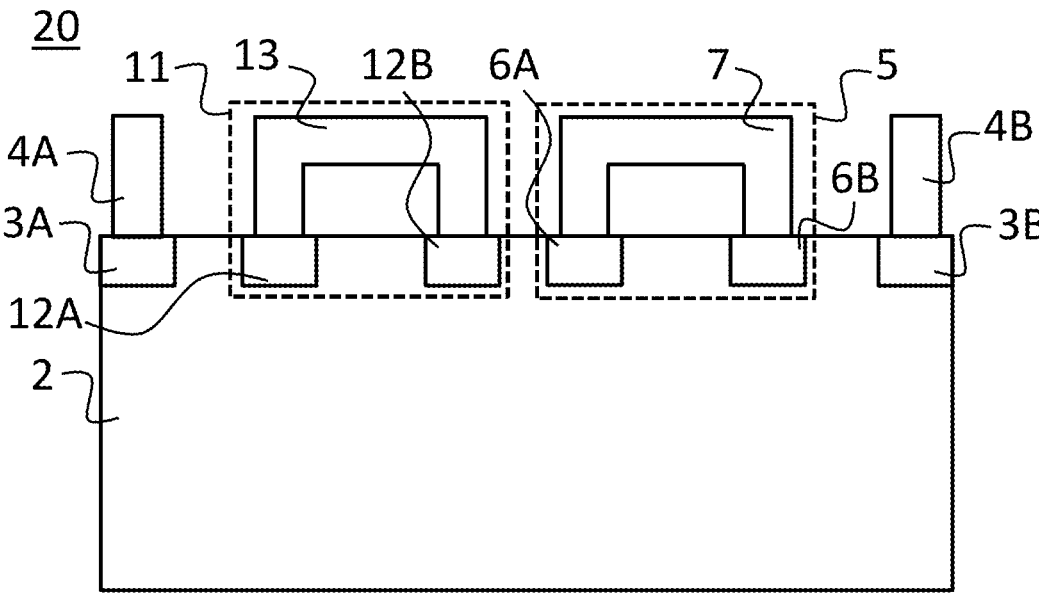
FIGS. 9A-9C are cross-sectional views of a diode according to various embodiments of the present disclosure.
Figure 9B:
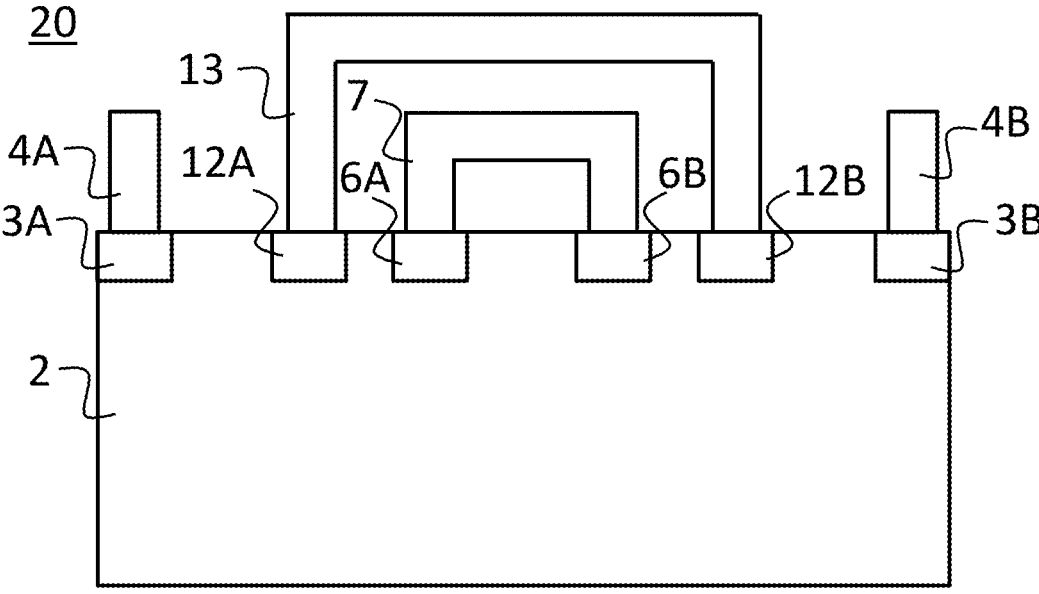
Figure 9C:
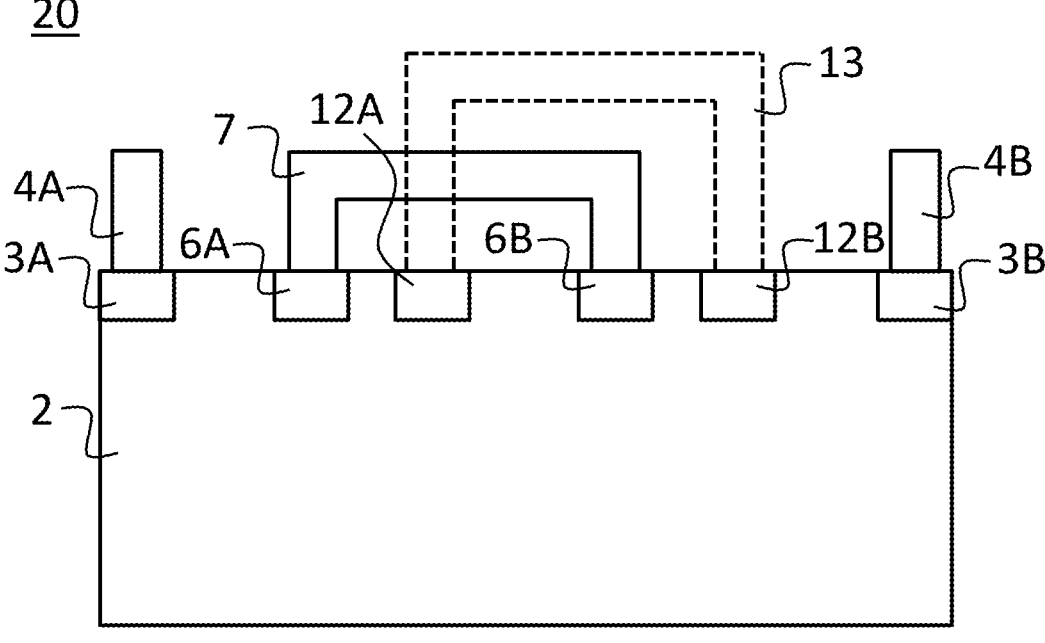

FIGS. 9A-9C show exemplary cross-sectional views of unit cell 20 comprising said third structure 11 in addition to first structure 5. Third structure 11 comprises a seventh semiconductor region 12A of the second charge type, an eighth semiconductor region 12B of the first charge type, and a third connection element 13 configured to electrically connect seventh semiconductor region 12A to eighth semiconductor region 12B.

Various configurations of third structure 11 in unit cells 20 are possible. In the embodiment shown in FIG. 8, first and third structure 5 and 11 within unit cell 20 may be spaced apart along a length of the anode and cathode (i.e., a length of the fingers). That is, unit cell 20 may comprise a portion in which only first structure 5 is included, and a portion in which only third structure 11 is included.

In this embodiment, one or more components of first and third structure 5 and 11 may also be interconnected, as indicated by the dashed line in FIG. 8. For example, unit cell 20 may comprise a first intermediate semiconductor region of the second charge type arranged in between and connected to third and seventh semiconductor region 6A and 12A. Additionally or alternatively, unit cell 20 may comprise a second intermediate semiconductor region of the first charge type arranged in between and connected to fourth and eighth semiconductor region 6B and 12B.

First structure 5 may be wider than third structure 11. For example, third semiconductor region 6A may be closer to first semiconductor region 3A (i.e., the anode) than seventh semiconductor region 12A. Additionally or alternatively, fourth semiconductor region 6B may be closer to eighth semiconductor region 12B with respect to fourth semiconductor region 6B.

Although only one first and third structure 5 and 11 in each unit cell 20 are shown in FIG. 8, the present disclosure is not limited thereto. For example, a plurality of first and third structures 5 and 11 can be alternately arranged along a length of first and second semiconductor regions 3A and 3B, such as to form a meandering combined structure having different associated distances with respect to first and second semiconductor regions 3A and 3B along a length thereof.

Alternatively, first and third structures 5 and 11 have a same or similar width instead of having different widths. For example, referring to FIG. 9A, first and third structure 5 and 11 may be identical to one another, and may be arranged in series in between the anode and cathode of unit cell 200. In FIG. 9A, third structure 11 is arranged in between the anode of unit cell 20 and first structure 5, and first structure 5 is arranged in between the cathode of unit cell 200 and third structure 11.

Referring to FIG. 9C, third structure 11 may be arranged such that seventh semiconductor region 12A is arranged in between third and fourth semiconductor region 6A and 6B of unit cell 20, and eighth semiconductor region 12B is arranged in between second and fourth semiconductor region 3B and 6B of unit cell 20.

In some embodiments, both first and third structure 5 and 11 in unit cell 20 may extend along the entire length of first and second semiconductor region 3A and 3B. For example, referring to FIGS. 9A and 9B, first and third connection elements 7 and 13 do not intersect, such that corresponding first and third structures 5 and 11 can extend along the entire length of the anode and cathode without being obstructed.

It will be appreciated that the concepts shown in the embodiments of the present disclosure in accordance with FIGS. 3-5B and FIGS. 8-9C can be readily combined in a single semiconductor device. For example, some unit cells 20 may comprise both first and third structure 5 and 11, while other unit cells 20 may comprise only first structure 5. Furthermore, a fourth structure may be included in between adjacent pairs of unit cells 20, the configuration of which with respect to second structure 8 may be substantially identical to the configuration of third structure 11 relative to first structure 5.

Furthermore, in the embodiments described above and in the corresponding figures, third and fourth semiconductor regions 6A and 6B of first structure 5 are shown as being spaced apart from one another. However, the present disclosure is not limited thereto. Third and fourth semiconductor regions 6A and 6B may be arranged adjacent to each other instead. This applies similarly to respective semiconductor regions of second structure 8 and third structure 11.

It is noted that although in the above description the semiconductor device according to the present disclosure is depicted as a (PiN)-diode, the present disclosure is not limited thereto. It will be appreciated by the skilled person that the present disclosure similarly applies to other types of semiconductor devices, such as bipolar junction transistors (BJTs), semiconductor-controlled rectifier (SCR) diodes (i.e., thyristors), and other semiconductor devices in which a semiconductor body, in which the semiconductor device is arranged, is flooded with charge carriers in order to activate the semiconductor device. In these semiconductor devices, the present disclosure may similarly limit an overvoltage to acceptable levels by injecting additional charge carriers into the semiconductor body.

Figure 10A:
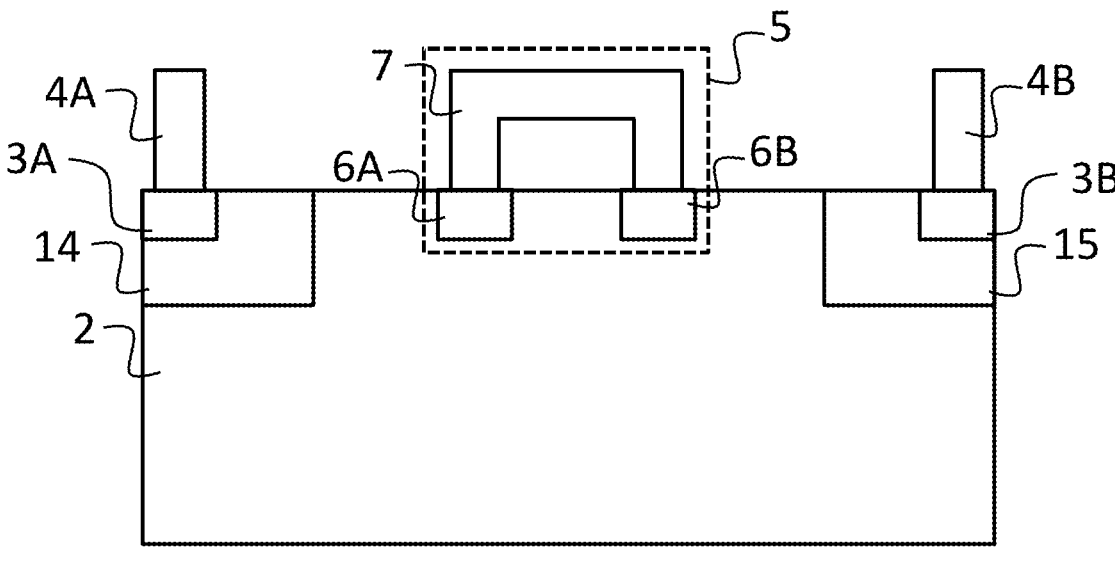
FIG. 10A is a cross-sectional view of a semiconductor-controlled rectifier diode according to an embodiment of the present disclosure.

FIG. 10A shows a cross-section of an SCR diode unit cell according to the present disclosure. The cross-section of FIG. 10A differs from that in FIG. 3A in that first semiconductor region 3A is surrounded by a first additional semiconductor region 14 of the second charge type, and in that second semiconductor region 3B is surrounded by a second additional semiconductor region 15 of the first charge type. Hence, then a PNPN-structure (or NPNP-structure) corresponding to an SCR diode is formed between first contact element 4A and second contact element 4B. Alternatively, second additional semiconductor region 15 may surround first additional semiconductor region 14 instead and second semiconductor region 3B is contacting semiconductor body 2 directly.

Figure 10B:
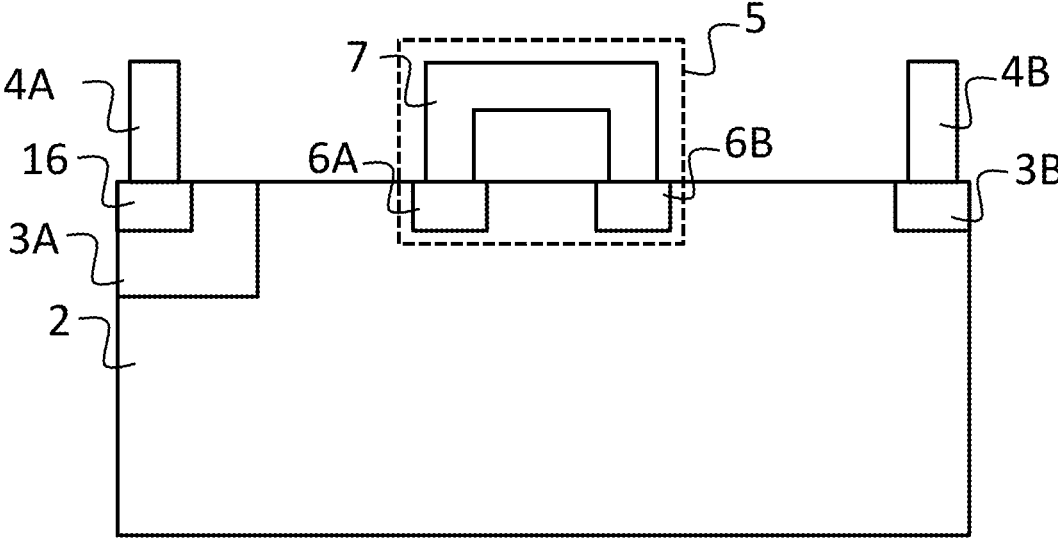
FIG. 10B is a cross-sectional view of a bipolar junction transistor according to an embodiment of the present disclosure.

FIG. 10B shows a cross-section of a BJT unit cell according to the present disclosure. The cross-section of FIG. 10B differs from that in FIG. 3A in that first semiconductor region 3A surrounds third additional semiconductor region 16 of the second charge type. Hence, a PNP (or NPN) structure corresponding to a BJT is formed between first contact element 4A and second contact element 4B.

First structure 5 according to the present disclosure serves a similar purpose as in the semiconductor device discussed with reference to FIGS. 3A-9C. That is, charge carriers of the second charge type are injected from third semiconductor region 6A and are collected at first semiconductor region 3A, while at the same time fourth semiconductor region 6B injects charge carriers of the first charge type that are collected at second semiconductor region 3B, thereby limiting the transient overvoltage across first and second contact elements 4A and 4B during a sudden flow of current, such as a current resulting from an ESD event. Furthermore, second and third structures 8 and 11 can similarly be included in a semiconductor device corresponding to the devices shown in FIGS. 10A and 10B.

It is noted that a top view of the semiconductor device shown in FIG. 10A or the semiconductor device shown in FIG. 10B may substantially correspond to the top view of any of FIGS. 4, 5B and 8. That is, the BJT or SCR diode may be formed using a plurality of unit cells arranged in a finger configuration similar to unit cells 20 of the diode discussed above with reference to the top views of FIGS. 4, 5B and 8.

A dopant concentration of each of the first to eighth semiconductor regions may lie in a range between 1e17-5e20 cm$^{-3}$. A dopant concentration of semiconductor body 2 may be equal to or less than 5e16 cm$^{-3}$.

In the above, the present disclosure has been explained using detailed embodiments thereof. However, it should be appreciated that the disclosure is not limited to these embodiments and that various modifications are possible without deviating from the scope of the present disclosure as defined by the appended claims.

What is claimed is:

1. A semiconductor device comprising one or more unit cells arranged in a semiconductor body, wherein each unit cell comprises:
an un-doped intrinsic region or substantially lightly doped semi-intrinsic, non-extrinsic semiconductor region of the semiconductor body;
a first semiconductor region of a first charge type;
a first contact element configured to provide an electrical contact to the first semiconductor region;
a second semiconductor region of a second charge type, wherein the second semiconductor region is spaced apart from the first semiconductor region;
a second contact element configured to provide an electrical contact to the second semiconductor region;
wherein at least one unit cell among the one or more unit cells further comprises a first structure, comprising:
a third semiconductor region of the second charge type arranged directly in the un-doped intrinsic or semi-intrinsic region of the semiconductor body;
a fourth semiconductor region of the first charge type arranged directly in the intrinsic or substantially lightly doped semi-intrinsic region of the semiconductor body; and
a first connection element configured to electrically connect the third semiconductor region to the fourth semiconductor region;
wherein the third semiconductor region is arranged in between the first semiconductor region and the fourth semiconductor region; and
wherein the fourth semiconductor region is arranged in between the second semiconductor region and the third semiconductor region.

2. The semiconductor device according to claim 1, wherein the semiconductor body includes a region of the first or second charge type that has a dopant concentration that is less than a respective dopant concentration of each of the first, second, third and fourth semiconductor regions;
  wherein each unit cell is operable in a first state and in a second state based on a voltage difference between the first contact element and the second contact element;
  a resistance between the first contact element and the second contact element is greater in the first state than in the second state due to a lower number of charge carriers in the semiconductor body; and
  while transitioning from the first state to the second state, the first, second, third and fourth semiconductor regions are each configured to inject charge carriers of their respective charge type into the semiconductor body.

3. The semiconductor device according to claim 1, wherein:
  each unit cell forms a PIN-diode; or
  each unit cell further comprising a first additional semiconductor region of the second charge type that surrounds the first semiconductor region, and a second additional semiconductor region of the first charge type that surrounds the second semiconductor region, wherein said unit cell(s) forms a semiconductor-controlled rectifier (SCR) diode; or
  each unit cell further comprising a third additional semiconductor region, wherein the third additional semiconductor region is surrounded by the first semiconductor region, wherein said unit cell(s) forms a bipolar junction transistor (BJT).

4. The semiconductor device according to claim 1, wherein:
  each unit cell further comprises a first additional semiconductor region of the second charge type that surrounds the first semiconductor region, and a second additional semiconductor region of the first charge type that surrounds the second semiconductor region, wherein each unit cell forms a semiconductor-controlled rectifier (SCR) diode.

5. The semiconductor device according to claim 1, wherein: each unit cell further comprises a third additional semiconductor region; wherein the third additional semiconductor region is surrounded by the first semiconductor region, wherein each unit cell forms a bipolar junction transistor (BJT).

6. The semiconductor device according to claim 1, wherein at least one unit cell among the one or more unit cells comprises a plurality of the first structures arranged in between the first and second semiconductor regions and being spaced apart from one another along a direction perpendicular to a direction from the first semiconductor region to the second semiconductor region.

7. The semiconductor device according to claim 1, wherein, when the semiconductor device comprises two or more unit cells, the semiconductor device further comprises one or more second structures, comprising:
  a fifth semiconductor region of the first charge type;
  a sixth semiconductor region of the second charge type;
  a second connection element configured to electrically connect the fifth semiconductor region to the sixth semiconductor region;
  wherein each of the one or more second structures is arranged in between a respective pair of adjacent unit cells of the semiconductor device;

wherein the fifth semiconductor region is arranged in between the sixth semiconductor region and the second semiconductor region corresponding to a unit cell among the pair of adjacent unit cells; and
  wherein the sixth semiconductor region is arranged in between the fifth semiconductor region and the first semiconductor region corresponding to another unit cell among the pair of adjacent unit cells.

8. The semiconductor device according to claim 7, wherein at least one unit cell among the one or more unit cells further comprises a third structure, comprising:
  a seventh semiconductor region of the second charge type;
  an eighth semiconductor region of the first charge type; and
  a third connection element configured to electrically connect the seventh semiconductor region to the eighth semiconductor region;
  wherein the third structure is arranged in between the first semiconductor region and the first structure, and wherein the seventh semiconductor region is arranged in between the first semiconductor region and the eighth semiconductor region, or
  wherein the seventh semiconductor region is arranged in between the first semiconductor region and the third semiconductor region, and wherein the eighth semiconductor region is arranged in between the second semiconductor region and the fourth semiconductor region, or
  wherein the seventh semiconductor region is arranged in between the first semiconductor region and the third semiconductor region, and wherein the eighth semiconductor region is arranged in between the third semiconductor region and the fourth semiconductor region.

9. The semiconductor device according to claim 1, wherein at least one unit cell among the one or more unit cells further comprises a third structure, comprising:
  a seventh semiconductor region of the second charge type;
  an eighth semiconductor region of the first charge type; and
  a third connection element configured to electrically connect the seventh semiconductor region to the eighth semiconductor region;
  wherein the seventh semiconductor region is arranged in between the first semiconductor region and the third semiconductor region, and wherein the eighth semiconductor region is arranged in between the second semiconductor region and the fourth semiconductor region.

10. The semiconductor device according to claim 1, wherein at least one unit cell among the one or more unit cells further comprises a third structure, comprising:
  a seventh semiconductor region of the second charge type;
  an eighth semiconductor region of the first charge type; and
  a third connection element configured to electrically connect the seventh semiconductor region to the eighth semiconductor region;
  wherein the seventh semiconductor region is arranged in between the first semiconductor region and the third semiconductor region, and wherein the eighth semiconductor region is arranged in between the third semiconductor region and the fourth semiconductor region.

11. The semiconductor device according to claim 2, wherein:

each unit cell forms a PiN-diode.

12. The semiconductor device according to claim 8, wherein each of the first, second, third, fourth, fifth, sixth, seventh and eighth semiconductor regions are mutually spaced apart from one another in a first direction from the first to the second semiconductor region and/or in a second direction perpendicular to the first direction.

13. The semiconductor device according to claim 12, wherein the seventh semiconductor region is spaced apart from the third semiconductor region in the first and second direction and wherein the eighth semiconductor region is spaced apart from the fourth semiconductor region in the first and second direction;

a distance between the first semiconductor region and the third semiconductor region is smaller than a distance between the first semiconductor region and the seventh semiconductor region; and/or a distance between the fourth semiconductor region and the second semiconductor region is smaller than a distance between the eighth semiconductor region and the second semiconductor region;

wherein the third connection element is physically connected to the first connection element.

14. The semiconductor device according to claim 13, wherein:

at least one unit cell among the one or more unit cells further comprises a first intermediate semiconductor region of the second charge type arranged in between and connected to the third and seventh semiconductor region; and/or at least one unit cell among the one or more unit cells further comprises a second intermediate semiconductor region of the first charge type arranged in between and connected to the fourth and eighth semiconductor region; and/or in so far as at least one unit cell among the one or more unit cells comprises the first and second intermediate semiconductor regions, the at least one unit cell further comprises an intermediate connection element configured to electrically connect the first intermediate semiconductor region to the second intermediate region, the intermediate connection element is coupled to the first and second connection elements of the at least one unit cell.

15. The semiconductor device according to claim 1, wherein the first contact elements of each unit cell among the one or more unit cells are mutually electrically connected, and/or wherein the second contact elements of each unit cell among the one or more unit cells are mutually electrically connected.

16. The semiconductor device according to claim 8, wherein the first connection element and/or, the second connection element and/or the third connection element comprises a conductive material selected from the group consisting of: aluminium, copper, gold, silver, polysilicon, tungsten, and titanium.

17. The semiconductor device according to claim 16, wherein the conductive material is arranged on top of a part of the semiconductor body and corresponding semiconductor regions; or wherein the semiconductor device further comprises a metal layer stack, wherein the metal layer stack comprises:

one or more metal layers that are mutually separated from each other and from the semiconductor body using a respective insulating layer among one or more insulating layers; and one or more vias for electrically connecting metal layers on different levels of the metal layer stack and for connecting a lowest metal layer in the metal layer stack to the semiconductor body;

wherein the first connection element and/or the second connection element and/or the third connection element is formed using the metal layer stack and wherein at least a part of the conductive material is separated from the semiconductor body by an insulating layer among the one or more insulating layers or by air;

wherein the first contact element and the second contact element of the one or more unit cells are formed using the metal layer stack, and a number of metal layers used for the formation of the first contact element and/or the second contact element is greater than a number of metal layers used for the formation of the first connection element and/or, the second connection element and/or the third connection element.

18. The semiconductor device according to claim 1, wherein the first, second, third, and fourth semiconductor regions and, the fifth, sixth, seventh and eighth semiconductor regions are ion-implanted regions; and/or wherein the first charge type corresponds to a p-type doping or an n-type doping, and wherein the second charge type corresponds to an n-type doping or a p-type doping, respectively; and/or wherein each of the one or more unit cells are substantially identical to one another; and/or wherein the semiconductor body is based on one material selected from the group consisting of: silicon (Si), silicon carbide (SIC), gallium nitride (GaN), and gallium arsenide (GaAs).

19. An electrostatic discharge (ESD) protection device configured to be electrically connected to an electronic circuit and to protect the electronic circuit from ESD events, wherein the ESD protection device comprises one or more semiconductor devices as defined in claim 1, and wherein the ESD protection device is a packaged device.

20. A device, comprising:

an electronic circuit integrated in a semiconductor body; and one or more semiconductor devices according to claim 1, the one or more semiconductor devices being integrated in the semiconductor body and being connected to the electronic circuit to protect the electronic circuit against electrostatic discharge (ESD) events, wherein the device is a packaged device.

* * * * *